United States Patent
Hada et al.

(10) Patent No.: US 6,897,012 B2
(45) Date of Patent: May 24, 2005

(54) NEGATIVE-WORKING PHOTORESIST COMPOSITION

(75) Inventors: Hideo Hada, Hiratsuka (JP); Takeshi Iwai, Sagamihara (JP); Satoshi Fujimura, Chigasaki (JP)

(73) Assignee: Tokyo Ohka Kogyo Co., Ltd., Kanagawa-ken (JP)

(*) Notice: Subject to any disclaimer, the term of this patent is extended or adjusted under 35 U.S.C. 154(b) by 0 days.

(21) Appl. No.: 10/837,629

(22) Filed: May 4, 2004

(65) Prior Publication Data

US 2004/0202966 A1 Oct. 14, 2004

Related U.S. Application Data

(62) Division of application No. 10/196,681, filed on Jul. 18, 2002, now Pat. No. 6,749,991, which is a division of application No. 09/865,530, filed on May 29, 2001, now Pat. No. 6,444,397, which is a continuation of application No. 09/436,652, filed on Nov. 9, 1999, now abandoned.

(30) Foreign Application Priority Data

Nov. 10, 1998 (JP) ........................................... 10-319645
Feb. 16, 1999 (JP) ........................................... 11-037847

(51) Int. Cl.[7] ............................ G03C 5/00; G03F 7/004
(52) U.S. Cl. ..................... 430/325; 430/270.1; 430/910
(58) Field of Search ............................. 430/270.1, 325, 430/910

(56) References Cited

U.S. PATENT DOCUMENTS 5,558,978 A 9/1996 Schadeli et al.
5,563,011 A 10/1996 Shipley

FOREIGN PATENT DOCUMENTS

JP 10-282667 10/1998
JP 10-282671 10/1998

OTHER PUBLICATIONS

Y. Tsuchiya et al., Journal of Photopolymer Science and Technology, 10(4), pp. 579–584 (1997).

K. Maeda et al., Journal of Photopolymer Science and Technology, 11(3), pp. 507–512 (1998).

S. Iwasa, SPIE, 3333, pp. 417–424 (1998).

Roberts et al., Basic Principles of Organic Chemistry, p. 560 (1964).

*Primary Examiner*—Rosemary Ashton
(74) *Attorney, Agent, or Firm*—Wenderoth, Lind & Ponack, L.L.P.

(57) ABSTRACT

Disclosed is a chemical-amplification negative-working photoresist composition used for photolithographic patterning in the manufacture of semiconductor devices suitable for patterning light-exposure to ArF excimer laser beams and capable of giving a high-resolution patterned resist layer free from swelling and having an orthogonal cross sectional profile by alkali-development. The characteristic ingredient of the composition is the resinous compound which has two types of functional groups, e.g., hydroxyalkyl groups and carboxyl or carboxylate ester groups, capable of reacting each with the other to form intramolecular and/or intermolecular ester linkages in the presence of an acid released from the radiation-sensitive acid generating agent to cause insolubilization of the resinous ingredient in an aqueous alkaline developer solution.

11 Claims, No Drawings

NEGATIVE-WORKING PHOTORESIST COMPOSITION

This is a divisional of Ser. No. 10/196,681, filed Jul. 18, 2002 now U.S. Pat. No. 6,749,991, which is a divisional of Ser. No. 09/865,530, filed May 29, 2001, now U.S. Pat. No. 6,444,397, which is a continuation of Ser. No. 09/436,652, filed Nov. 9, 1999, filed now abandoned.

BACKGROUND OF THE INVENTION

The present invention relates to a negative-working photoresist composition or, more particularly, to a chemical-amplification negative-working photoresist composition suitable for use in the photolithographic patterning works in the manufacture of various electronic devices, which has high transparency to the ArF excimer laser beams for pattern-wise exposure and is capable of giving a finely patterned resist layer with high pattern resolution along with little swellability of the resist layer in the developer solution and excellently orthogonal cross sectional profile of the patterned resist layer.

As is disclosed in Japanese Patent Publication 8-3635 and elsewhere, the basic formulation of a chemical-amplification negative-working photoresist composition is known, which comprises a radiation-sensitive acid-generating agent, an alkali-soluble resin such as novolak resins, polyhydroxystyrene resins and the like and an amino resin such as melamine resins, urea resins and the like in combination and in which the alkali-soluble resinous ingredient in the exposed areas of the resist layer is rendered alkali-insoluble in the presence of the acid generated from the acid-generating agent. Namely, a crosslinking reaction proceeds between the alkali-soluble resin and the amino resin by interacting with the acid generated by irradiation with actinic rays to form a pattern-wise latent image of the alkali-insolubilized resin which is developed with an alkaline developer solution to dissolve away the resist layer in the unexposed areas leaving a negatively patterned resist layer in the exposed areas.

The chemical-amplification negative-working photoresist composition of the above described type comprising an acid-generating agent, alkali-soluble resin and amino resin is quite satisfactory for use in the photolithographic process in which the exposure light is the i-line ultraviolet light or KrF excimer laser beam of 248 nm wavelength. As a trend in recent years, however, it is desired to employ an exposure light of a shorter wavelength such as ArF excimer laser beams in order to comply with the requirement for finer and finer patterning in the manufacture of semiconductor devices of higher degrees of integration, for which the photoresist composition of the above described type cannot be quite satisfactory.

Various proposals have been made heretofore for chemical-amplification negative-working photoresist compositions suitable for the photolithographic patterning work using ArF excimer laser beams as the exposure light, referred to as an ArF resist hereinafter, including (1) those comprising a resinous base ingredient derived from a copolymer of 5-methylenebiscyclo [2.2.1]-2-heptane and maleic acid by esterifying one of the carboxyl groups of the maleic acid moiety, an aliphatic cyclic polyhydric alcohol as the cross-linking agent and an acid-generating agent disclosed in Journal of Photopolymer Science and Technology, volume 10, No. 4, pages 579–584 (1997), (2) those comprising a resinous base ingredient which is a copolymer of a first acrylic acid ester having an epoxy group-containing cyclic hydrocarbon group in the ester portion of the molecule and a second acrylic acid ester having a carboxyl group-containing cyclic hydrocarbon group in the ester portion of the molecule in combination with a crosslinking agent and an acid-generating agent which are each the same one as mentioned above disclosed in Journal of Photopolymer Science and Technology, volume 11, No. 3, pages 507–512 (1998) and (3) those comprising a resinous base ingredient which is a copolymer of a first acrylic acid ester having a hydroxyl group-containing cyclic hydrocarbon group in the ester portion of the molecule and a second acrylic acid ester having a carboxyl group-containing cyclic hydrocarbon group in the ester portion of the molecule in combination with a crosslinking agent and an acid generating agent which are each the same one as mentioned above disclosed in SPIE Advances in Resist Technology and Processing XIV, volume 3333, pages 417–424 (1998).

The feature of the above described ArF resists is that, in order to increase the transparency of the base resin to the ArF excimer laser beams and to obtain alkali-solubility of the resin, the resin is modified by introducing carboxyl group-containing polycyclic hydrocarbon groups susceptible to crosslinking and by introducing epoxy groups and alcoholic hydroxyl groups into the resin so as to enhance crosslink-ability.

Although, in the ArF resist compositions of the above described types, a negatively-patterned resist layer can be formed by the crosslinking reaction of the resinous ingredient and the crosslinking agent in the presence of an acid generated by irradiation with ArF excimer laser beams by virtue of the ester or ether linkages, the resist composition in the exposed areas still contains remaining uncrosslinked carboxyl groups and alcoholic hydroxyl groups so that the resist layer in the exposed areas becomes swollen more or less in the development treatment with an alkaline developer solution undesirably resulting a patterned resist layer having round shoulders in the cross sectional profile not to ensure high quality of the patterned resist layer.

SUMMARY OF THE INVENTION

The object of the present invention is, under the above described problems in the conventional ArF resists, to provide a chemical-amplification negative-working photoresist composition having high transparency to the ArF excimer laser beams and capable of giving a high-resolution patterned resist layer having little swellability in an alkaline developer solution and having an excellently orthogonal cross sectional profile.

Thus, the present invention provides an alkali-developable chemical-amplification negative-working photoresist composition which comprises, as a uniform solution in an organic solvent:

(A) a compound capable of releasing an acid by irradiation with actinic rays; and (B) a resinous compound capable of being insolubilized in an aqueous alkaline solution by interacting with an acid, the resinous compound as the component (B) having, in the molecule, two kinds of functional groups capable of reacting each with the other by dehydration or dealcoholation to form an ester linkage in the presence of an acid whereby the resinous compound is insolubilized in an aqueous alkaline solution.

In particular, the resinous compound as the component (B) has, in a molecule, a hydroxyalkyl group and a carboxyl group or carboxylate ester group in combination as the two kinds of the ester linkage-forming functional groups.

DETAILED DESCRIPTION OF THE PREFERRED EMBODIMENTS

As is described above, the most characteristic ingredient in the inventive ArF resist is the component (B) which is a resinous compound having, in the molecule, two kinds of functional groups, such as a combination of hydroxyalkyl groups and carboxyl groups or carboxylate ester groups, capable of forming, by a dehydration or dealcoholation reaction, an intermolecular or intramolecular ester linkage so that the resinous compound is insolubilized in an aqueous alkaline solution leaving only small numbers of unreacted alcoholic hydroxyl groups, carboxyl groups and carboxylate ester groups which are responsible to swelling of the resist layer in the light-exposed areas.

The component (A) in the inventive ArF resist composition is a so-called radiation-sensitive acid-generating agent which is a compound capable of releasing an acid by decomposition when irradiated with actinic rays such as ArF excimer laser beams. Such a compound is not particularly limitative and can be any one selected from conventional acid-generating agent formulated in chemical-amplification negative-working photoresist compositions in the prior art, of which onium salt compounds having an alkyl or halogenated alkyl sulfonic acid ion as the anion in the molecule are preferable.

The counter cation in the above mentioned onium salt compounds is selected preferably from ions of phenyl iodonium, and phenyl sulfonium, which may optionally be substituted by a lower alkyl group such as methyl, ethyl, propyl, n-butyl and tert-butyl groups and lower alkoxy groups such as methoxy and ethoxy groups, as well as dimethyl(4-hydroxynaphthyl) sulfonium.

The anion in the onium salt compound is preferably a fluoroalkylsulfonic acid ion having 1 to 10 carbon atoms substituted for a part or all of the hydrogen atoms by fluorine atoms. In particular, perfluoroalkylsulfonic acid ions are preferable in respect of the acid strength of the sulfonic acid since the acid strength of the sulfonic acid is decreased as the number of carbon atoms in the fluoroalkyl group is increased and as the degree of fluorination of the alkyl group, i.e. proportion of the hydrogen atoms substituted by fluorine atoms, is decreased.

Particular examples of onium salt compounds suitable as the component (A) include diphenyliodonium trifluoromethane sulfonate and nonafluorobutane sulfonate, bis(4-tert-butyl-phenyl)iodonium trifluoromethane sulfonate and nonafluorobutane sulfonate, triphenylsulfonium trifluoromethane sulfonate and nonafluorobutane sulfonate, tri(4-methylphenyl)-sulfonium trifluoromethane sulfonate and nonafluorobutane sulfonate, dimethyl(4-hydroxynaphthyl) sulfonium trifluoromethane sulfonate and nonafluorobutane sulfonate and the like, which can be used either singly or as a combination of two kinds or more according to need.

The component (B) used in combination with the above described component (A) in the inventive ArF resist composition is a base resinous ingredient capable of being insolubilized in an aqueous alkaline solution in the presence of an acid. The resin has, in the molecule, two kinds of functional groups which can react each with the other in the presence of an acid generated from the component (A) by irradiation with actinic rays to form an ester linkage by a dehydration or dealcoholation reaction so as to insolubilize the resin in an aqueous alkaline solution.

The above mentioned two kinds of functional groups capable of reacting each with the other to form an ester linkage can be provided, for example, by a combination of a hydroxyl group and a carboxyl group or carboxylate ester group from which an ester linkage is formed by the dehydration reaction or dealcoholation reaction.

Such resinous compounds include those resins having hydroxyalkyl groups and carboxyl groups and/or carboxylate ester groups as pendants to the main skeletal chain of the polymer molecule.

Particular examples of preferable resinous compound suitable as the component (B) in the inventive ArF resist composition include: (1) homopolymers and copolymers of one or more of monomers selected from α-(hydroxyalkyl) acrylic acids and/or alkyl esters thereof and (2) copolymers of (a) a monomer selected from α-(hydroxyalkyl)acrylic acids and alkyl esters thereof and (b) a monomer selected from other ethylenically unsaturated carboxylic acids and esters thereof.

The above mentioned polymeric resin of the class (1) is preferably a copolymer of an α-(hydroxyalkyl)acrylic acid and an alkyl ester of an α-(hydroxyalkyl)acrylic acid. The ethylenically unsaturated carboxylic acid or an ester thereof as the comonomer (b) forming the polymeric resin of the class (2) above includes acrylic acid, methacrylic acid, alkyl esters of acrylic acid and alkyl esters of methacrylic acid.

The hydroxyalkyl group in the above mentioned α-(hydroxyalkyl) acrylic acids and alkyl esters thereof is exemplified by lower hydroxyalkyl groups such as hydroxymethyl, hydroxyethyl, hydroxypropyl and hydroxybutyl groups, of which hydroxymethyl and hydroxyethyl groups are preferred in respect of their good reactivity to form an ester linkage.

The alkyl group forming the alkyl ester of an α-(hydroxyalkyl)acrylic acid is exemplified by lower alkyl groups having 1 to 5 carbon atoms such as methyl, ethyl, propyl, isopropyl, n-butyl, sec-butyl, tert-butyl and amyl groups and crosslinked polycyclic hydrocarbon groups such as bicyclo[2.2.1]heptyl, bornyl, adamantyl, tetracyclo-[4.4.0.1$^{2,5}$.1$^{7,10}$]dodecyl and tricyclo[5.2.1.0$^{2,6}$]decyl groups. An alkyl ester monomer of which the ester-forming alkyl group is such a crosslinked polycyclic hydrocarbon group is advantageous in respect of imparting the resist composition with improved resistance against dry etching. On the other hand, the lower alkyl groups such as methyl, ethyl, propyl and butyl groups are preferable because of the inexpensiveness of the alcoholic compounds from which the alkyl esters are formed.

While, when the alkyl group forming the carboxylate ester group in the monomer is a lower alkyl group, like a carboxyl group, the carboxylate ester group has good reactivity with the hydroxyalkyl group to form an ester linkage, the cross-linked polycyclic hydrocarbon group as the ester-forming group of the ester monomer is less reactive for the formation of an ester linkage so that, when introduction of crosslinked polycyclic hydrocarbon groups is desired into the resinous compound as the component (B), the resinous compound preferably should also have carboxyl groups as the pendant of the molecule.

The ethylenically unsaturated carboxylic acid or an ester thereof as the comonomer (b) to form the copolymeric resinous compound of the above mentioned class (2) is exemplified by unsaturated carboxylic acids such as acrylic, methacrylic, maleic and fumaric acids and alkyl esters thereof such as methyl, ethyl, propyl, isopropyl, n-butyl, isobutyl, n-hexyl and octyl esters. Acrylate and methacrylate ester monomers of which the ester-forming group is a crosslinked polycyclic hydrocarbon group such as bicyclo [2.2.1]heptyl, bornyl, adamantyl, tetracyclo[4.4.0.1$^{2,5}$.1$^{7,10}$]

dodecyl and tricyclo-[5.2.1.0²,⁶]decyl groups can also be used as the comonomer (b).

Preferable among the above named various monomers are lower alkyl esters of (meth)acrylic acid such as methyl, ethyl, propyl and butyl esters in respect of their inexpensiveness and good availability.

In the resinous compound of the above described class (2) as the component (B), the weight proportion of the monomeric units derived from the comonomer (a) and the monomeric units derived from the comonomer (b) is in the range from 20:80 to 90:10 or, preferably, from 50:50 to 85:15 in order to ensure good reactivity for the formation of intermolecular or intra-molecular ester linkages so that the ArF resist composition can give an excellent resist pattern.

In the next place, description is given of the dehydration and dealcoholation reaction for the formation of intramolecular or intermolecular ester linkages by way of specific examples.

In the homopolymer or copolymer of the above mentioned class (1), the intramolecular cyclic ester linkages are formed in the presence of an acid according to the reaction scheme expressed by the following equation:

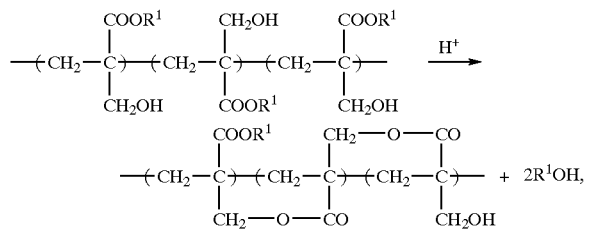

in which $R^1$ is a hydrogen atom or an ester-forming group such as lower alkyl groups, e.g., methyl, ethyl, propyl, isopropyl, n-butyl, sec-butyl, tert-butyl and amyl groups, and cross-linked polycyclic hydrocarbon groups, e.g., bicyclo[2.2.1]-heptyl, bornyl, adamantyl, tetracyclo[4.4.0.1²,⁵.1⁷,¹⁰]dodecyl and tricyclo[5.2.1.0²,⁶]decyl groups, either singly or as a combination of two kinds or more in a molecule.

On the other hand, the reaction for the formation of intermolecular ester linkages in the same resinous compound proceeds according to the reaction scheme expressed by the following equation:

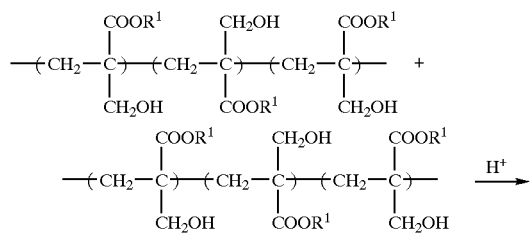

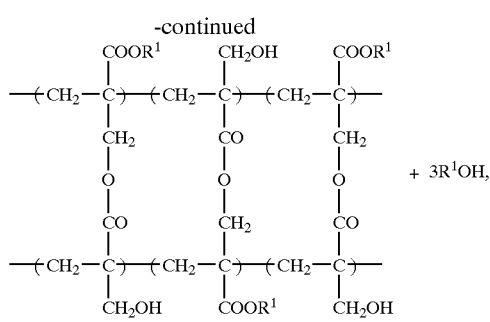

in which $R^1$ has the same meaning as defined above.

In the resinous compound of the above mentioned class (2), the reaction for the formation of intramolecular ester linkages proceeds according to the reaction scheme expressed by the following equation:

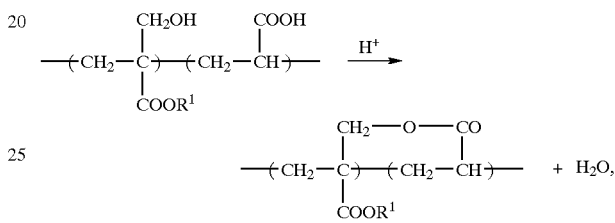

in which $R^1$ has the same meaning as defined above.

On the other hand, the reaction for the formation of intermolecular ester linkages in the same resinous compound proceeds according to the reaction scheme expressed by the following equation:

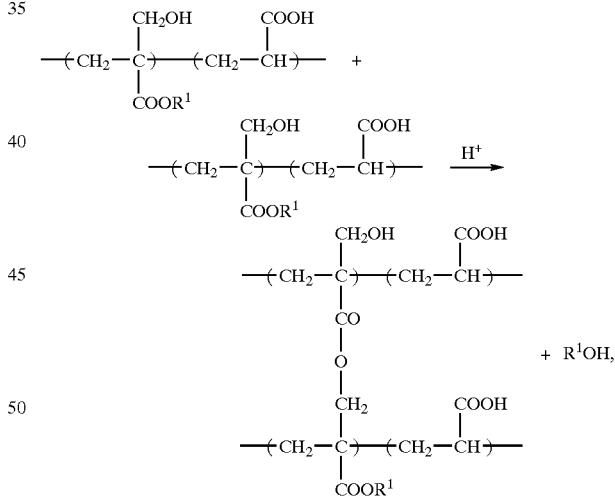

in which $R^1$ has the same meaning as defined above.

The above described various types of resinous compounds suitable as the component (B) can be used either singly or as a combination of two kinds or more according to need. The resinous compound as the component (B) has a weight-average molecular weight in the range from 2000 to 20000 or, preferably, from 4000 to 15000.

While the essential ingredients in the inventive ArF resist composition are the above described components (A) and (B) alone, it is optional that the ArF resist composition further comprises a crosslinking agent as the component (C) which can react with the component (B) to form ether linkages, in addition to the intramolecular or intermolecular ester linkages, resulting in an increased crosslinking density in the resist layer so that improvements can be accomplished in the pattern resolution and cross sectional profile of the patterned resist layer as well as in the resistance of the resist layer against dry etching.

Various kinds of known crosslinking agents can be used as the component (C) without particular limitations as selected from those conventionally employed in chemical-amplification negative-working photoresist compositions. Examples of suitable crosslinking agents include (1) aliphatic cyclic hydrocarbon groups and oxygen-containing derivatives thereof having a hydroxyl group and/or a hydroxyalkyl group such as 2,3-dihydroxy-5-hydroxymethyl norbornane, 2-hydroxy-5,6-bis(hydroxymethyl) norbornane, cyclohexane dimethanol, 3,4,8- and 3,4,9-trihydroxy tricyclodecane, 2-methyl-2-adamantanol, 1,4-dioxane-2,3-diol, 1,3,5-trihydroxy cyclohexane and the like and (2) reaction products of an amino group-containing compound such as melamine, acetoguanamine, benzoguanamine, urea, ethyleneurea and glycoluril with formaldehyde or a combination of formaldehyde and a lower alcohol so as to convert the hydrogen atoms of the amino groups into hydroxymethyl or lower alkoxymethyl groups including, in particular, hexamethoxymethyl melamine, bismethoxymethyl urea, bis-methoxymethyl bismethoxyethylene urea, tetrakis-methoxymethyl glycoluril and tetrakisbutoxymethyl glycoluril, of which tetrakisbutoxymethyl glycoluril is particularly preferable, although any of these compounds can be used either singly or as a combination of two kinds or more.

In the formulation of the inventive ArF resist composition, the amount of the component (A) is in the range from 0.5 to 30 parts by weight or, preferably, from 1 to 10 parts by weight per 100 parts by weight of the component (B). When the amount of the component (A) is too small relative to the component (B), formation of the image pattern would be incomplete while, when the amount thereof is too large, difficulties are encountered in the preparation of a uniform resist composition in the form of a solution or the solution, if it could ever be obtained, suffers a decrease in the storage stability due to limited solubility of the compound in an organic solvent.

The amount of the optional component (C), when compounded, in the inventive ArF resist composition is in the range from 1 to 50 parts by weight or, preferably, from 5 to 20 parts by weight per 100 parts by weight of the component (B). When the amount of the component (C) is too small, the desired effect for the increase of the crosslinking density in the resist layer cannot be fully exhibited as a matter of course while, when the amount thereof is too large, difficulties are encountered in the preparation of a uniform resist composition in the form of a solution or the solution, if it could ever be obtained, suffers a decrease in the storage stability.

The inventive ArF resist composition can be prepared by uniformly dissolving, in an organic solvent, each a specified amount of the above described components (A), (B) and, optionally, (C). Various kinds of organic solvents can be used for this-purpose including ketone solvents such as acetone, methyl ethyl ketone, cyclohexanone, methyl isoamyl ketone and 2-heptanone, polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof, cyclic ethers such as dioxane and tetrahydrofuran, ester solvents such as methyl lactate, ethyl lactate, methyl acetate, ethyl acetate, butyl acetate, methyl pyruvate, ethyl pyruvate, methyl methoxypropionate and ethyl ethoxypropionate and amide solvents such as N,N-dimethylformamide, N,N-dimethylacetamide and N-methyl-2-pyrrolidone. These organic solvents can be used either singly or as a mixture of two kinds or more according to need.

It is of course optional that the inventive ArF resist composition comprising the above described components (A), (B) and, optionally, (C) further contains a variety of additives having miscibility or compatibility such as auxiliary resinous compounds as an improver of the resist film properties, plasticizers, stabilizers, coloring agents, surface active agents and the like each in a limited amount.

The photolithographic patterning procedure by using the inventive ArF resist composition is not particularly different from the procedure by using a conventional photoresist composition. Namely, a substrate such as a semiconductor silicon wafer is coated with the inventive resist composition in the form of a solution by using a suitable coating machine such as a spinner followed by drying or a pre-baking treatment to form a dried photoresist layer which is exposed pattern-wise to actinic rays such as ArF excimer laser beams through a photomask bearing a desired pattern on a minifying projection exposure machine followed by a post-exposure baking treatment to form a latent image of the pattern. Thereafter, a development treatment is undertaken with an aqueous alkaline developer solution such as a 1 to 10% by weight aqueous solution of tetramethylammonium hydroxide to produce a patterned resist layer having high fidelity to the photomask pattern.

The above described photolithographic patterning procedure is applicable not only to a semiconductor silicon wafer mentioned above but also to any substrate materials to which the procedure using a conventional photoresist composition is applied including silicon wafers provided with an antireflection coating film of an organic or inorganic material and glass substrates.

In the following, the present invention is described in more detail by way of examples, which, however, never limit the scope of the invention in any way. In the following description, the term of "parts" always refers to "parts by weight".

Preparation 1.

A homopolymer of ethyl α-(hydroxymethyl)acrylate, referred to as the Polymer 1 hereinafter, was prepared in the following manner.

Thus, a polymerization mixture prepared by dissolving, in 200 g of tetrahydrofuran, 32.5 g (10.25 ml) of ethyl α-(hydroxymethyl)acrylate and 1.62 g of azobisisobutyronitrile as a polymerization initiator was heated at 70° C. for 3 hours under agitation to effect the polymerization reaction. After completion of the polymerization reaction, the polymerization mixture was poured into 1 liter of n-heptane to precipitate the polymer which was further purified by repeating the reprecipitation treatment followed by drying at room temperature under reduced pressure to give 20.5 g of a dried polymer which was a homopolymer of ethyl α-(hydroxymethyl)acrylate having a weight-average molecular weight of 12500 with a molecular weight dispersion of 2.1.

Preparation 2.

A copolymer of α-(hydroxymethyl)acrylic acid and ethyl α-(hydroxymethyl)acrylate, referred to as the Polymer 2 hereinafter, was prepared in the following manner.

Thus, a polymerization mixture prepared by dissolving, in 200 g of tetrahydrofuran, 5.1 g (0.05 mole) of α-(hydroxymethyl)acrylic acid, 26.0 g (0.20 mole) of ethyl α-(hydroxymethyl)acrylate and 1.62 g of azobisisobutyronitrile as a polymerization initiator was heated at 70° C. for 3 hours to effect the polymerization reaction. After completion of the polymerization reaction, the polymerization mixture was poured into 1 liter of n-heptane to precipitate the polymer which was further purified by repeating the reprecipitation treatment followed by drying at room temperature under reduced pressure to give 23.0 g of a dried polymer which was a copolymer of α-(hydroxymethyl)acrylic acid and ethyl α-(hydroxymethyl)acrylate having a weight-average molecular weight of 13500 with a molecular weight dispersion of 2.2.

Preparation 3.

A copolymer of methacrylic acid and ethyl α-(hydroxymethyl)acrylate, referred to as the Polymer 3 hereinafter, was prepared in the following manner.

Thus, a polymerization mixture prepared by dissolving, in 200 g of tetrahydrofuran, 4.3 g (0.05 mole) of methacrylic acid, 26.0 g (0.20 mole) of ethyl α-(hydroxymethyl)acrylate and 1.62 g of azobisisobutyronitrile as a polymerization initiator was heated at 70° C. for 3 hours to effect the polymerization reaction. After completion of the polymerization reaction, the polymerization mixture was poured into 1 liter of n-heptane to precipitate the polymer which was further purified by repeating the reprecipitation treatment followed by drying at room temperature under reduced pressure to give 19.0 g of a dried polymer which was a copolymer of methacrylic acid and ethyl α-(hydroxymethyl)acrylate having a weight-average molecular weight of 15500 with a molecular weight dispersion of 1.9.

Preparation 4.

A copolymer of ethyl α-(hydroxymethyl)acrylate and carboxytetracyclo[4.4.0.1$^{2,5}$.1$^{7,10}$]dodecyl methacrylate, referred to as the Polymer 4 hereinafter, was prepared in about the same manner as in Preparation 3 excepting for replacement of 4.3 g of methacrylic acid with 14.5 g (0.05 mole) of carboxytetracyclo[4.4.0.1$^{2,5}$.1$^{7,10}$]dodecyl methacrylate expressed by the structural formula

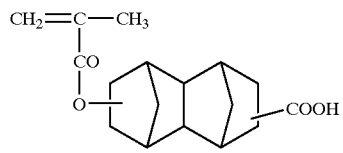

to give 20.2 g of a dried polymer which was a copolymer of carboxytetracyclo[4.4.0.1$^{2,5}$.1$^{7,10}$]dodecyl methacrylate and ethyl α-(hydroxymethyl)acrylate having a weight-average molecular weight of 14000 with a molecular weight dispersion of 1.8.

Preparation 5 (Comparative).

A copolymer of methacrylic acid and hydroxyethyl methacrylate, referred to as the Polymer 5 hereinafter, was prepared in the following manner.

Thus, a polymerization mixture prepared by dissolving, in 200 g of tetrahydrofuran, 4.3 g (0.05 mole) of methacrylic acid, 26.0 g (0.20 mole) of hydroxyethyl methacrylate and 1.62 g of azobisisobutyronitrile as a polymerization initiator was heated at 70° C. for 3 hours to effect the polymerization reaction. After completion of the polymerization reaction, the polymerization mixture was poured into 1 liter of n-heptane to precipitate the polymer which was collected by filtration and dried at room temperature under reduced pressure to give 20.0 g of a dried polymer which was a copolymer of methacrylic acid and hydroxyethyl methacrylate having a weight-average molecular weight of 11000 with a molecular weight dispersion of 1.75.

Preparation 6 (Comparative).

A copolymer of hydroxyethyl methacrylate and carboxytetracyclo[4.4.0.1$^{2,5}$.1$^{7,10}$]dodecyl methacrylate, referred to as the Polymer 6 hereinafter, was prepared in about the same manner as in Preparation 5 excepting for replacement of 4.3 g of methacrylic acid with 14.5 g (0.05 mole) of carboxytetracyclo[4.4.0.1$^{2,5}$.1$^{7,10}$]dodecyl methacrylate to give 14.0 g of a dried polymer which was a copolymer of hydroxyethyl methacrylate and carboxytetracyclo[4.4.0.1$^{2,5}$.1$^{7,10}$]dodecyl methacrylate having a weight-average molecular weight of 16000 with a molecular weight dispersion of 2.0.

EXAMPLE 1

A negative-working photoresist solution was prepared by dissolving 100 parts of the Polymer 1 prepared in Preparation 1 and 3 parts of triphenylsulfonium trifluoromethanesulfonate in 670 parts of propyleneglycol monomethyl ether.

A semiconductor silicon wafer was coated with this photoresist solution by using a spinner followed by a drying and pre-baking treatment for 90 seconds on a hot plate at 120° C. to form a photoresist layer having a thickness of 0.5 μm. The photoresist layer was pattern-wise exposed to ArF excimer laser beams of 193 nm wavelength on an ArF exposure machine (manufactured by Nikon Co.) followed by a post-exposure baking treatment at 150° C. for 30 minutes and then subjected to a puddle development treatment at 23° C. for 65 seconds with a 2.38% by weight aqueous solution of tetramethylammonium hydroxide followed by rinse for 30 seconds with water and drying.

The exposure dose with the ArF excimer laser beams was taken as a measure of the photosensitivity of the photoresist composition to find that a patterned resist layer of good quality having a line width of 0.50 μm could be obtained with an exposure dose of 100 mJ/cm². The patterned resist layer was free from swelling as examined on a scanning electron microscopic photograph for the cross sectional profile of the patterned resist layer.

EXAMPLE 2

The experimental procedure was substantially the same as in Example 1 excepting for replacement of the Polymer 1 with the same amount of the Polymer 2 prepared in Preparation 2.

The exposure dose as a measure of the sensitivity of the resist composition was 70 mJ/cm² for the formation of a line-patterned resist layer of 0.40 μm line width. The patterned resist layer was free from swelling as examined on a scanning electron microscopic photograph for the cross sectional profile of the patterned resist layer.

EXAMPLE 3

The experimental procedure was substantially the same as in Example 1 excepting for replacement of the Polymer 1 with the same amount of the Polymer 3 prepared in Preparation 3.

The exposure dose as a measure of the sensitivity of the resist composition was 68 mJ/cm² for the formation of a line-patterned resist layer of 0.30 μm line width. The patterned resist layer was free from swelling as examined on a scanning electron microscopic photograph for the cross sectional profile of the patterned resist layer.

EXAMPLE 4

The experimental procedure was about the same as in Example 1 except that the photoresist solution was further admixed with 10 parts of tetrakismethoxymethyl glycoluril, the prebaking treatment was performed at 100° C. for 90 seconds and the post-exposure baking treatment was performed at 120° C. for 90 seconds.

The exposure dose as a measure of the sensitivity of the resist composition was 90 mJ/cm$^2$ for the formation of a line-patterned resist layer of 0.30 μm line width. The patterned resist layer was free from swelling as examined on a scanning electron microscopic photograph for the cross sectional profile of the patterned resist layer. The cross sectional profile was slightly trapezoidal.

EXAMPLE 5

The experimental procedure was about the same as in Example 2 except that the photoresist solution was further admixed with 10 parts of tetrakismethoxymethyl glycoluril, the prebaking treatment was performed at 100° C. for 90 seconds and the post-exposure baking treatment was performed at 120° C. for 90 seconds.

The exposure dose as a measure of the sensitivity of the resist composition was 40 mJ/cm$^2$ for the formation of a line-patterned resist layer of 0.20 μm line width. The patterned resist layer was free from swelling as examined on a scanning electron microscopic photograph for the cross sectional profile of the patterned resist layer. The cross sectional profile was orthogonal.

EXAMPLE 6

The experimental procedure was about the same as in Example 3 except that the photoresist solution was further admixed with 10 parts of tetrakismethoxymethyl glycoluril, the prebaking treatment was performed at 100° C. for 90 seconds and the post-exposure baking treatment was performed at 120° C. for 90 seconds.

The exposure dose as a measure of the sensitivity of the resist composition was 40 mJ/cm$^2$ for the formation of a line-patterned resist layer of 0.18 μm line width. The patterned resist layer was free from swelling as examined on a scanning electron microscopic photograph for the cross sectional profile of the patterned resist layer. The cross sectional profile was orthogonal.

EXAMPLE 7

The experimental procedure was about the same as in Example 4 excepting for replacement of the Polymer 1 with the same amount of the Polymer 4 prepared in Preparation 4.

The exposure dose as a measure of the sensitivity of the resist composition was 35 mJ/cm$^2$ for the formation of a line-patterned resist layer of 0.20 μm line width. The patterned resist layer was free from swelling as examined on a scanning electron microscopic photograph for the cross sectional profile of the patterned resist layer.

EXAMPLE 8

A negative-working photoresist solution was prepared by dissolving 100 parts of the Polymer 1 prepared in Preparation 1, 3 parts of triphenylsulfonium trifluoromethanesulfonate and 10 parts of tetrakisbutoxymethyl glycoluril in 500 parts of propyleneglycol monomethyl ether.

A semiconductor silicon wafer was coated with this photoresist solution by using a spinner followed by a drying and prebaking treatment for 90 seconds on a hot plate at 100° C. to form a photoresist layer having a thickness of 0.5 μm. The photoresist layer was pattern-wise exposed to ArF excimer laser beams of 193 nm wavelength on an ArF exposure machine (manufactured by Nikon Co.) followed by a post-exposure baking treatment at 120° C. for 90 seconds and then subjected to a puddle development treatment at 23° C. for 65 seconds with a 2.38% by weight aqueous solution of tetramethylammonium hydroxide followed by rinse for 30 seconds with water and drying.

The exposure dose with the ArF excimer laser beams was taken as a measure of the photosensitivity of the photoresist composition to find that a patterned resist layer of good quality having a line width of 0.20 μm could be obtained with an exposure dose of 32 mJ/cm$^2$. The patterned resist layer was free from swelling as examined on a scanning electron microscopic photograph for the cross sectional profile of the patterned resist layer. The cross sectional profile was excellently orthogonal.

COMPARATIVE EXAMPLE 1

The experimental procedure was substantially the same as in Example 1 excepting for replacement of the Polymer 1 with the same amount of the Polymer 5 prepared in Preparation 5.

The thus obtained patterned resist layer was examined on a scanning electron microscopic photograph for the cross sectional profile to find that the resist layer was swollen and isolation of the resist lines was incomplete.

COMPARATIVE EXAMPLE 2

The experimental procedure was substantially the same as in Example 4 excepting for replacement of the Polymer 1 with the same amount of the Polymer 5.

The exposure dose as a measure of the sensitivity of the resist composition was 50 mJ/cm$^2$ for the formation of a line-patterned resist layer of 0.18 μm line width. The patterned resist layer, however, was found to be in a swollen state as examined on a scanning electron microscopic photograph for the cross sectional profile of the patterned resist layer and the top portions of the line-patterned resist layer were laterally bulged.

COMPARATIVE EXAMPLE 3

The photoresist solution was prepared in the same formulation as in Example 1 except that the Polymer 1 was replaced with the same amount of the Polymer 6 prepared in Preparation 6 and the photoresist solution was further admixed with 10 parts of tetrakismethoxymethyl glycoluril. The procedure for patterning of the resist layer was performed under substantially the same conditions as in Example 4.

The exposure dose as a measure of the sensitivity of the resist composition was 70 mJ/cm$^2$ for the formation of a line-patterned resist layer of 0.25 μm line width. The patterned resist layer was found to be in a swollen state as examined on a scanning electron microscopic photograph for the cross sectional profile of the patterned resist layer.

What is claimed is:

1. A method for the formation of a resist pattern on a substrate which comprises the steps of:
   (1) coating a substrate surface with an alkali-developable chemical-amplification negative-working photoresist composition which comprises, as a uniform solution in an organic solvent, (A) from 0.5 to 30 parts by weight of a compound capable of releasing an acid by irradiation with actinic rays and (B) 100 parts by weight of a resinous compound capable of being insolubilized in an aqueous alkaline solution in the presence of an acid, the resinous compound as the component (B) having, in the molecule, two kinds of functional groups capable of reacting each with the other to form an intermolecular or intramolecular ester linkage in the presence of an acid whereby the resinous compound is insolubilized in an aqueous alkaline solution;

(2) drying or pre-baking the coating layer of the aqueous coating solution to form a dried photoresist layer;

(3) patternwise exposing the dried photoresist layer to actinic rays through a photomask;

(4) subjecting the photoresist layer to a post-exposure baking treatment to form a latent image of the pattern; and (5) developing the photoresist layer with an aqueous alkaline developer solution to form a patterned resist layer.

2. The method for the formation of a resist pattern as claimed in claim 1 in which the resinous compound as the component (B) has two kinds of functional groups consisting of at least one hydroxyl group and at least one carboxyl group or carboxylic acid ester group in a molecule.

3. The method for the formation of a resist pattern as claimed in claim 2 in which the hydroxyl groups, carboxyl groups and carboxylic acid ester groups in the resinous compound as the component (B) are each bonded to a pendant group to the molecule of the resin.

4. The method for the formation of a resist pattern as claimed in claim 2 in which the resinous compound as the component (B) has, in a molecule, at least one hydroxyl group in the form of a hydroxyalkyl group.

5. The method for the formation of a resist pattern as claimed in claim 4 in which the resinous compound as the component (B) is a copolymer of (a) a monomeric compound or monomeric compounds selected from the group consisting of α-(hydroxyalkyl)acrylic acids and alkyl α-(hydroxyalkyl)acrylates and (b) a monomeric compound or monomeric compounds selected from the group consisting of acrylic acid, methacrylic acid and esters thereof.

6. The method for the formation of a resist pattern as claimed in claim 1 in which the amount of the component (A) is in the range from 1 to 10 parts by weight per 100 parts by weight of the component (B).

7. The method for the formation of a resist pattern as claimed in claim 1 in which the chemical-amplification negative-working photoresist composition further comprises:

(C) from 1 to 50 parts by weight of a crosslinking agent which is a compound selected from the group consisting of aliphatic cyclic hydrocarbon compounds and oxygen-containing derivatives thereof having a hydroxyl group or hydroxyalkyl group in the molecule and amine compounds of which at least one of the hydrogen atoms of the amino group is substituted by a hydroxymethyl group or a lower alkoxymethyl group.

8. The method for the formation of a resist pattern as claimed in claim 7 in which the crosslinking agent as the component (C) is a tetrakisalkoxymethyl glycoluril.

9. The method for the formation of a resist pattern as claimed in claim 1 in which the component (A) is an onium salt compound having a halogen-substituted or unsubstituted alkylsulfonic acid ion as the anion.

10. The method for the formation of a resist pattern as claimed in claim 9 in which the component (A) is triphenylsulfonium trifluoromethanesulfonate.

11. The method for the formation of a resist pattern as claimed in claim 7 in which the amount of the component (C) is in the range from 5 to 20 parts by weight per 100 parts by weight of the component (B).

* * * * *